United States Patent [19]

Brown et al.

[11] 4,227,944
[45] Oct. 14, 1980

[54] METHODS OF MAKING COMPOSITE CONDUCTIVE STRUCTURES IN INTEGRATED CIRCUITS

[75] Inventors: Dale M. Brown; Tat-Sing P. Chow, both of Schenectady, N.Y.; James F. Gibbons, Palo Alto, Calif.; Paul A. McConnelee, Schenectady, N.Y.

[73] Assignee: General Electric Company, Schenectady, N.Y.

[21] Appl. No.: 47,888

[22] Filed: Jun. 11, 1979

[51] Int. Cl.² .......................................... H01L 21/283
[52] U.S. Cl. ....................................... 148/6; 427/88; 427/91; 427/93; 357/67; 357/71
[58] Field of Search .............. 427/93, 88, 91; 29/589, 29/590; 357/67, 71; 148/6

[56] References Cited
U.S. PATENT DOCUMENTS

| | | | |
|---|---|---|---|
| 3,375,418 | 3/1968 | Garnache et al. | 427/86 |
| 4,109,372 | 8/1978 | Geffken | 29/590 |
| 4,128,670 | 12/1978 | Gaensslen | 427/88 |

*Primary Examiner*—Ralph S. Kendall
*Attorney, Agent, or Firm*—Julius J. Zaskalicky; James C. Davis, Jr.; Marvin Snyder

[57] ABSTRACT

A method of making a composite conductive structure is described. The structure includes an insulating substrate on which is provided a conductor of a refractory metal substantially nonreactive with silicon dioxide covered by a layer of a silicide of the refractory metal and a layer of silicon dioxide. The method includes depositing a layer of polycrystalline silicon over the conductor and the insulating substrate, reacting the layer of polycrystalline silicon with the conductor to form a refractory metal silicide, removing the unreacted portion of the layer of polycrystalline silicon, and then oxidizing the exposed surface of the refractory metal silicide into a layer of silicon dioxide.

16 Claims, 7 Drawing Figures

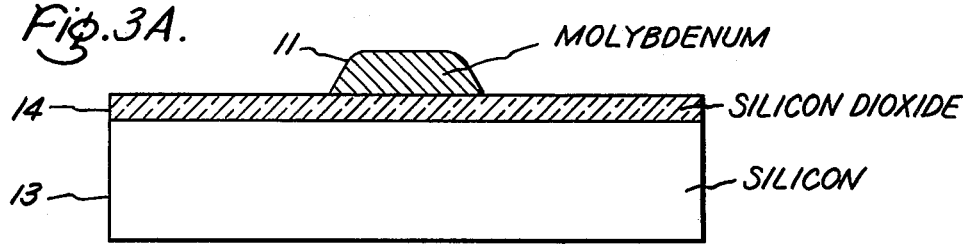
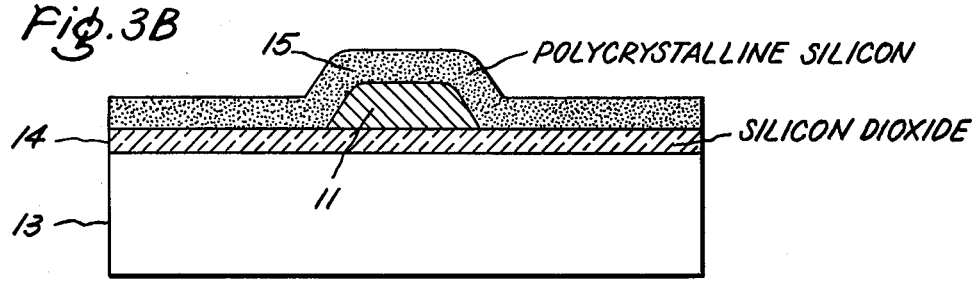
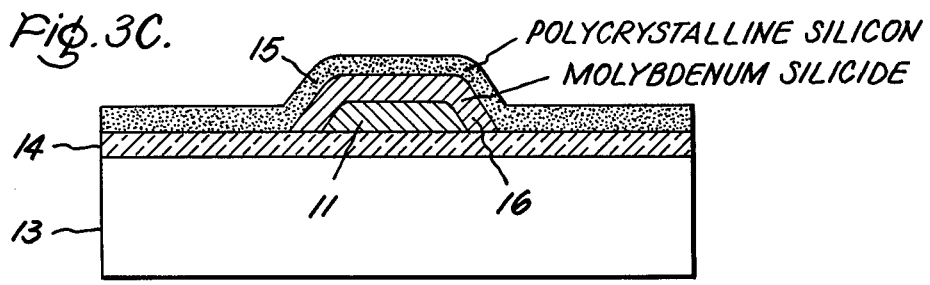
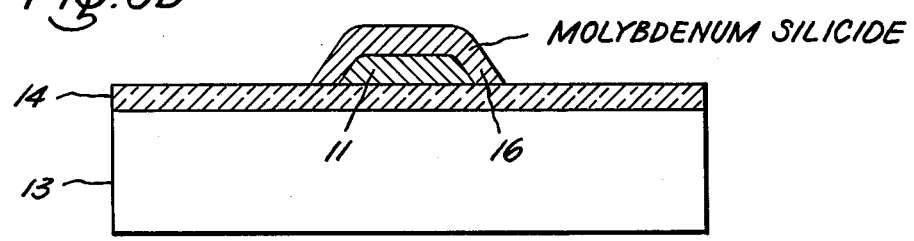
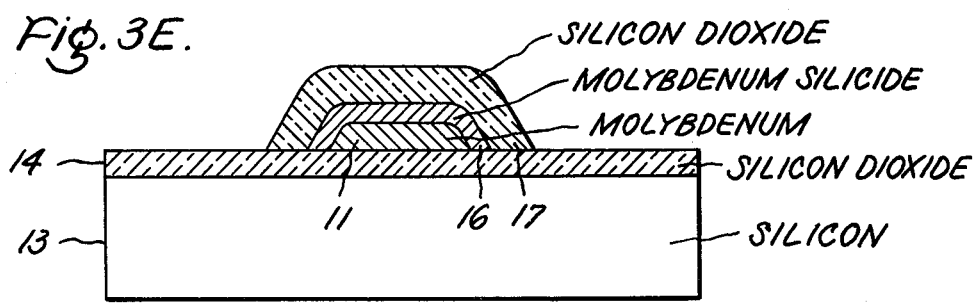

METHODS OF MAKING COMPOSITE CONDUCTIVE STRUCTURES IN INTEGRATED CIRCUITS

The present invention relates to methods of making composite conductive structures in integrated circuit devices.

In a copending patent application, Ser. No. 47889, filed June 11, 1979, assigned to the assignee of the present application there is described and claimed a composite structure which comprises a substrate of semiconductor material having a major surface on which is included a layer of insulating material. A conductor of metallic material selected from the class of refractory metals which are substantially nonreactive with silicon dioxide is provided overlying the insulating layer. A layer of a silicide of the metallic material is provided over the exposed surfaces of the conductor. A layer of silicon dioxide is formed over the exposed surfaces of the layer of the silicide of the metallic material.

The present invention is directed to providing improved methods of making such composite conductive structures.

In carrying out the present invention in an illustrative embodiment there is provided a substrate of semiconductor material having an overlying layer of insulating material. A conductor of a metallic material selected from the class of refractory metals which are substantially nonreactive with silicon dioxide in a desired pattern is formed overlying the layer of insulating material. A layer of polycrystalline silicon is formed over the conductor of metallic material and the layer of insulating material. The substrate including the conductor of metallic material and overlying layer of polycrystalline silicon is heated to a temperature and for a time to cause the layer of polycrystalline silicon to react with a portion of the conductor to form a layer of a silicide of the metallic material overlying a remaining portion of the conductor unconverted to a silicide thereof. The portion of the layer of polycrystalline silicon which has not reacted with the metallic material is removed. The substrate including the conductor and the layer of the metal silicide is heated in an oxidizing atmosphere at a temperature and for a time to cause the oxidant to react with the layer of the silicide to convert a portion thereof to silicon dioxide overlying another portion of the layer of the silicide unconverted to silicon dioxide. Alternatively, the layer of the silicide of the metallic material may be completely converted to silicon dioxide.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIGS. 3A-3E show cross-sections of structures representing successive steps in one method of fabricating the composite structure of FIGS. 1 and 2 in accordance with the present invention.

Figure 1:
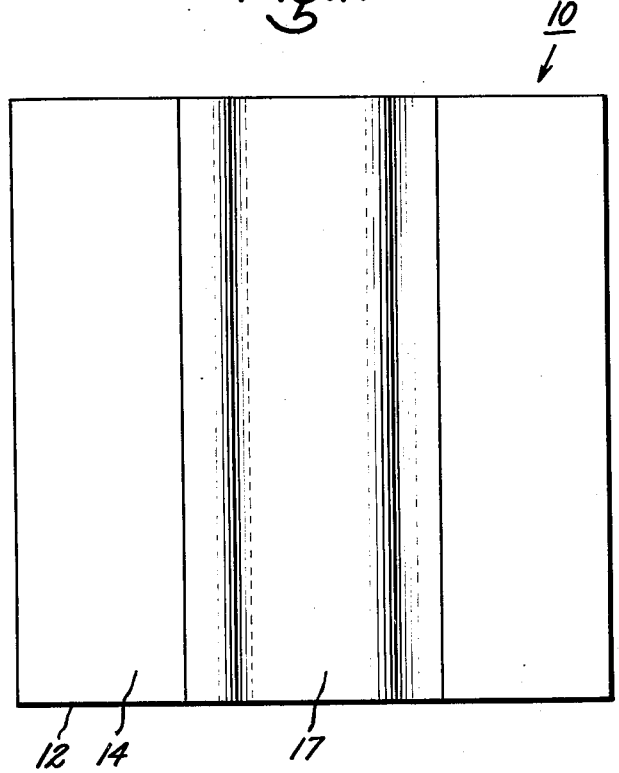
FIG. 1 is a plan view of a composite body which includes an insulating substrate on which a first level of metallization of molybdenum has been formed followed by a layer of molybdenum silicide and thereafter followed by a passivating layer of silicon dioxide.

Referring now to FIG. 1 there is shown a composite body 10 illustrating a first level conductor 11 of molybdenum made in accordance with the present invention. The composite body 10 includes a substrate 12 constituted of a substrate 13 of silicon on which a layer 14 of silicon dioxide has been formed. The layer 14 may represent either gate or field oxide of an integrated circuit, such as an imaging array, a memory array or a signal or data processing circuit. Overlying the insulating layer 14 is the conductor 11 of molybdenum. The conductor 11 may be formed by initially providing a layer of molybdenum on the surface of the insulating layer 12 to a suitable thickness, for example, several thousand Angstroms by sputtering, for example, and thereafter patterning the layer by photoresist masking and etching techniques well known in the art. Overlying the conductor 11 and completely covering the exposed portions thereof is provided a layer 16 of molybdenum silicide which, for example, may be 1000 Angstroms thick bonded to the molybdenum conductor 11. Overlying and bonded to the layer 16 of molybdenum silicide is provided a layer 17 of silicon dioxide.

Figure 2:
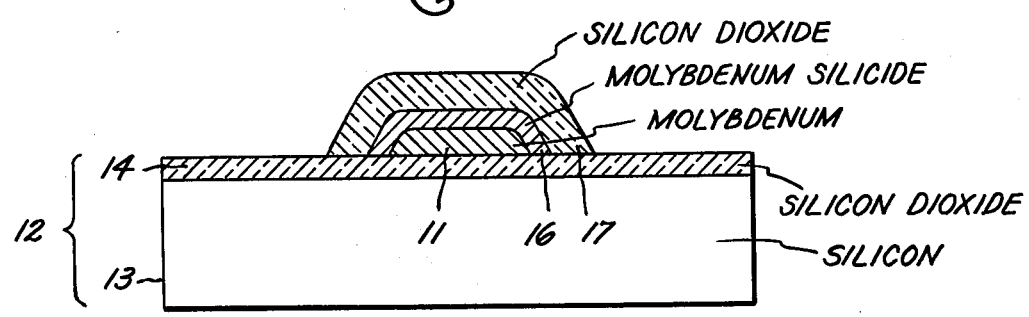
FIG. 2 is a cross-sectional view of the body of FIG. 1 taken along section lines 2—2 thereof.

A method of fabricating the composite structure of FIGS. 1 and 2 will now be described in connection with FIGS. 3A-3E. Elements of FIGS. 3A-3E identical to elements of FIGS. 1 and 2 are identically designated. A substrate 13 of silicon semiconductor material about 10 mils thick with a layer 14 of thermally-grown silicon dioxide about 1000 Angstroms thick thereon is provided. A layer of molybdenum 3000 Angstroms thick is deposited on the insulating layer by sputtering. The layer of molybdenum is patterned using photoresist masking and etching techniques well-known in the art to provide a conductor 11, as shown in FIG. 3A. Thereafter, a layer of polycrystalline silicone 15 about 2000 Angstroms thick is deposited over the molybdenum conductor 11 and the layer 14 of silicon dioxide by pyrolytic decomposition of silane at about 750° C. in a stream of an inert carrier gas such as argon to provide the structure shown in FIG. 3B. This structure is heated in an inert atmosphere to a temperature of about 1000° C. for a time to react the polycrystalline silicon with the molybdenum conductor 11 to produce a suitably thick layer of molybdenum silicide overlying the unreacted portion of the molybdenum conductor 11 and bonded thereto as shown in FIG. 3C. Next, the unreacted portions of the layer of polycrystalline is etched with a suitable silicon etch, such as an aqueous solution of potassium hydroxide which selectively etches the polycrystalline silicon without significantly etching the molybdenum silicide layer 16 or insulating layer 14 of silicon dioxide to provide the structure shown in FIG. 3D in which the conductor 11 is covered by an overlying layer 16 of molybdenum silicide. The composite body of FIG. 3D is then oxidized in an oxidizing atmosphere at a temperature of about 1000° C. to cause a portion of the layer 16 of molybdenum silicide to be oxidized into silicon dioxide leaving a portion of the layer of molybdenum silicide covering the molybdenum conductor 11, as shown in FIG. 3E. This portion of the layer of molybdenum silicide provides a shield between the molybdenum conductor 11 and the oxidizing atmosphere and conveniently is selected to be several thousand Angstroms thick, although it can be substantially thinner. The initial thickness of the molybdenum silicide layer of the composite body of FIG. 3C is selected to be sufficiently thick to enable a silicon dioxide layer 17 of the desired thickness to be provided, as shown in FIG. 3E. For example, when a second level of metallization is to be provided over the silicon dioxide layer, the silicon dioxide layer would be made sufficiently thick to provide good electrical insulation between the two levels. The thickness of this layer 17 of silicon dioxide and the thickness of the remaining portion of the layer 16 of molybdenum silicide is dependent on the time and temperature of the oxidation process. Thus, a composite structure including a molybdenum conductor completely encapsulated by silicon dioxide is provided.

While the invention has been described and illustrated in connection with composite electrode structures in which the conductor 11 is constituted of molybdenum, it is apparent that in view of the similarity in the compounds of tungsten to the compounds of molybdenum, particularly the oxides and silicides, the conductor 11 may be constituted of tungsten. Also, the conductor 11 may be constituted of other refractory metals which are substantially nonreactive with silicon dioxide such as tantalum, platinum and palladium. In addition, the alloys of the refractory metals mentioned above in which refractory metal constitutes a major portion thereof are suitable for the conductor 11.

While in the method described above the unreacted polycrystalline silicon was removed prior to the oxidation of the molybdenum silicide as shown in FIG. 3D, it will be understood that the oxidation of the silicide may be accomplished without removal of the unreacted polycrystalline silicon.

While the layer of insulating material 14 on which the conductive member 11 of molybdenum was formed is silicon dioxide, it is apparent that the insulating layer may be constituted of any of a number of materials such as, for example, silicon nitride, or a layer of silicon nitride overlying a layer of silicon dioxide, or combinations thereof. Also, while a silicon substrate has been shown as the material on which the insulating layer of silicon dioxide is formed, any of a number of semiconductor substrates may be utilized, for example, gallium arsenide.

While the invention has been described in specific embodiments, it will be appreciated that modifications, such as those described above may be made by those skilled in the art and it is intended by the appended claims to cover all such modifications and changes as fall in the true spirit and scope of the invention.

What we claim as new and desire to secure by Letters Patent of the United States is:

1. A method of forming a composite structure comprising
    providing a substrate of semiconductor material having an overlying layer of insulating material,
    forming a conductor of a refractory metal which is substantially nonreactive with silicon dioxide in a desired pattern overlying said layer of insulating material,
    forming over said conductor of metallic material and said layer of insulating material a layer of polycrystalline silicon,
    heating said substrate including said conductor of metallic material and said overlying layer of polycrystalline silicon to a temperature and for a time to cause said layer of polycrystalline silicon to react with a portion of said conductor to form a layer of a silicide of said metallic material overlying a remaining portion of said conductor unconverted to a silicide thereof,
    removing the portion of said layer of polycrystalline silicon which has not reacted with said metallic material,
    heating said substrate including said conductor and said layer of said metal silicide in an oxidizing atmosphere at a temperature and for a time to cause said oxidizing atmosphere to react with said layer of said silicide to convert a portion thereof to silicon dioxide overlying another portion of said layer of said silicide unconverted to silicon dioxide.

2. The method of claim 1 in which said refractory metal is selected from the class consisting of molybdenum, tungsten, tantalum, platinum and palladium.

3. The method of claim 2 in which said metallic material is molybdenum.

4. The method of claim 2 in which said metallic material is tungsten.

5. The method of claim 2 in which said metallic material is tantalum.

6. The method of claim 2 in which said metallic material is platinum.

7. The method of claim 2 in which said metallic material is palladium.

8. The method of claim 1 in which the unreacted portion of said layer of polycrystalline silicon is removed by etching with an etchant which etches polycrystalline silicon substantially faster than said silicide of said metallic material.

9. The method of claim 8 in which said etchant is an aqueous solution of potassium hydroxide.

10. The method of claim 1 in which said layer of polycrystalline silicon is provided by chemical vapor deposition of silicon.

11. The method of claim 1 in which the temperature to which said substrate is heated to cause said layer of polycrystalline silicon to react with said conductor is above 1000° C.

12. The method of claim 1 in which said substrate is heated at a temperature and for a time to convert substantially all of said layer of said silicide to silicon dioxide.

13. The method of claim 1 in which said insulating material is silicon dioxide.

14. The method of claim 1 in which said layer of insulating material is constituted of a layer of silicon nitride overlying a layer of silicon dioxide, said conductor overlying said layer of silicon nitride.

15. The method of claim 1 in which said insulating material is a composite of silicon dioxide and silicon nitride.

16. The method of claim 1 in which said semiconductor material is silicon.

* * * * *